United States Patent [19]

Layher

[11] Patent Number: 4,773,940

[45] Date of Patent: Sep. 27, 1988

[54] LEAD FRAME PREPARATION FOR SOLDER DIPPING

[75] Inventor: Francis W. Layher, Los Gatos, Calif.

[73] Assignee: National Semiconductor Corporation, Santa Clara, Calif.

[21] Appl. No.: 903,696

[22] Filed: Sep. 4, 1986

[51] Int. Cl.[4] .............................................. B08B 30/00
[52] U.S. Cl. ......................................... 134/28; 134/38; 228/179; 228/180.1; 29/65
[58] Field of Search ...................... 134/2, 3, 25.1, 25.4, 134/28, 10, 18, 38; 228/179, 180.1, 80.2, 36, 37, 59; 29/625

[56] References Cited

U.S. PATENT DOCUMENTS

| | | | |
|---|---|---|---|
| 3,386,166 | 6/1968 | Tardoskegyi | 29/625 |
| 4,566,934 | 1/1986 | Brasen et al. | 134/3 |
| 4,610,798 | 9/1986 | Benkus | 134/3 |

Primary Examiner—H. M. S. Sneed
Assistant Examiner—Sharon T. Cohen
Attorney, Agent, or Firm—Limbach, Limbach & Sutton

[57] ABSTRACT

Metal leads are prepared for solder dipping by first exposing the leads to a fifty percent solution of sulfuric acid. The leads are then rinsed using city water and exposed to solution consisting of fifty percent sulfuric acid, twenty-five percent nitric acid and twenty-five percent deionized water. The leads are then rinsed sequentially in city water and deionized water. Finally, excess water is removed from the leads.

6 Claims, 1 Drawing Sheet

LEAD FRAME PREPARATION FOR SOLDER DIPPING

BACKGROUND OF THE INVENTION

1. Field of the Invention

The present invention relates to semiconductor integrated circuits and, in particular, to a method of preparing the leads of a packaged semiconductor integrated circuit for solder dipping.

2. Discussion of the Prior Art

Some applications for semiconductor integrated circuits require that the IC device be protected from a harsh operating environment. To provide this protection, integrated circuit manufacturers have encapsulated the IC device in a sandwich-like package of the type shown in FIG. 1.

The package shown in FIG. 1 consists of a ceramic bottom plate 10 and a ceramic top plate 12, with an IC device 14 attached to the bottom plate 10. A glass sealant material 16 is disposed between the bottom plate 10 and the top plate 12 to form a sandwich-like protective structure. Leads 18, which provide the external electrical connections for the electrodes of the IC device, extend laterally through the glass sealant material 16 between the top plate 12 and the bottom plate 10.

It is common practice to prepare the metal leads 18 for further processing, such as, for example, for solder dipping, by subjecting them to a cleaning process which removes oxides formed during previous manufacturing steps. The conventional method for removing these oxides from the leads is to submerge the entire packaged device in a solution of 60% sulfuric acid ($H_2SO_4$) for a period of five minutes at room temperature. Following this sulfuric acid treatment, the leads are exposed to a 40% solution of nitric acid ($HNO_3$) for a period of 30 seconds at room temperature and then submerged in Nickel Wet, Alpha 994, which comprises a 10% solution of hydrochloric acid (HCl), for a period of 1-2 minutes. Following this three-step cleaning process, the exposed portions of the leads 18 are sufficiently clean to permit solder dipping.

It has been found, however, that the above-described cleaning process results in severe etching of the glass sealant material 16, particularly in those cases where the sealant material 16 utilizes a high lead oxide (PbO) content. Referring to FIG. 1, this is particularly true along the interface between the leads 18 and the sealant material 16. Experiments have shown that, as might be expected, the acids contained in the cleaning solutions are the cause of the glass attack. Sulfuric acid is the least corrosive, with nitric and hydrochloric acid being severe corrosive agents.

Corrosion of the glass sealant material causes particular concern with respect to the hermeticity of the semiconductor package. Since the commonly-used glass sealant materials, such as for example XS 1175, and 7583, contain some porosity, etching of the glass surface results in the exposure of air pockets within the sealant structure. These pockets serve as excellent hosts for detection gases or fluids used in hermeticity testing. Thus, when the semiconductor device is tested for hermeticity, i.e., for its ability to prevent exposure of the integrated circuit device to the ambient, detection fluids trapped by the exposed sealant glass pockets are detected by the test device. Since there is no way to determine the extent to which the detection fluid has seeped through the sealant glass toward the IC device, there is no way to determine whether the device itself has been affected. Therefore, detection of an abnormal amount of detection fluid in the package must result in rejection of the device.

It would be desirable to have available a process which could clean the device leads sufficiently to prepare them for solder dipping while avoiding attack of the glass sealant material.

SUMMARY OF THE INVENTION

It is an object of the present invention to provide a method of cleaning metal leads while preventing attack of the sealant glass at the glass-to-metal interface.

These and other objects of the invention are accomplished by providing a method of preparing metal leads for solder dipping which comprises the steps of exposing the leads to a 50% solution of sulfuric acid at 150° C. for 30 seconds; rinsing the leads with city water; stripping oxide from the leads using a solution consisting of 50% sulfuric acid, 25% nitric acid and 25% deionized water; sequentially rinsing the leads in city water, deionized water and hot deionized water; and removing excess water from the leads in a spin dry.

DETAILED DESCRIPTION OF A PREFERRED EMBODIMENT

Figure 1:
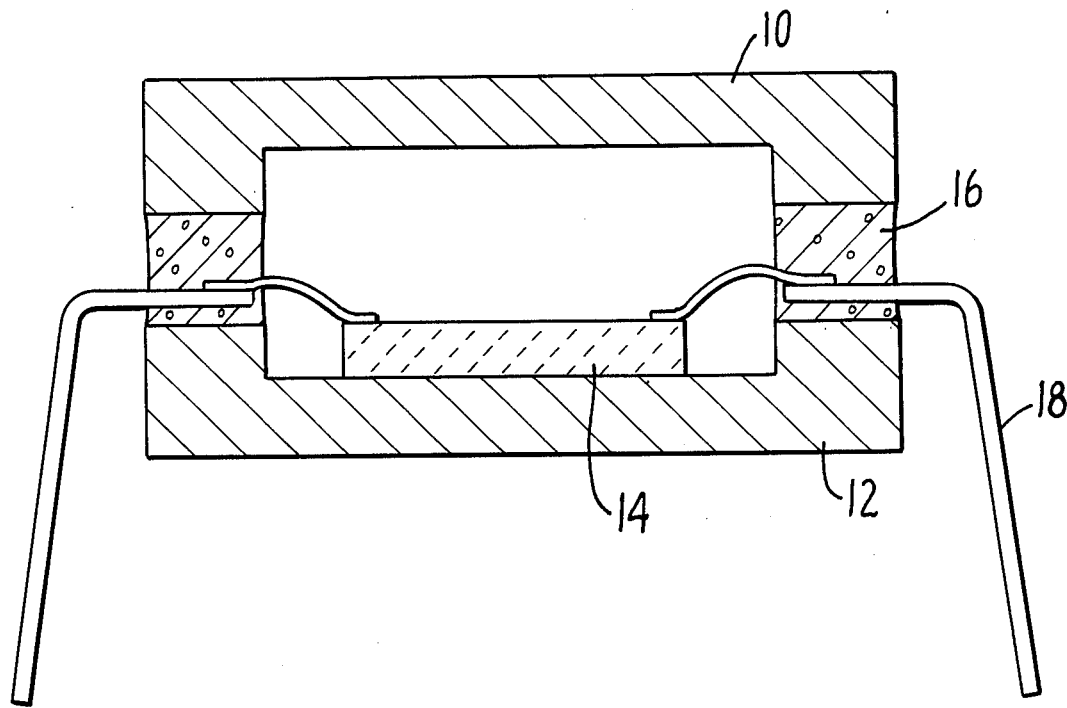

According to the method of the present invention, the metal leads of a packaged semiconductor integrated circuit, which typically are formed from 42 Alloy, are cleaned according to the following sequential steps: (1) submerge in 150° F., 50% sulfuric acid for 30 seconds; (2) rinse in city water; (3) expose to a room temperature "Bright Dip" for a period of five seconds, wherein the Bright Dip includes 25% nitric acid; (4) sequentially rinse in city water, 2 M Ohm deionized water and hot, preferably 135° F., deionized water; and (5) spin dry. The term "city water" refers to tap water generally available from a municipal water treatment system or of comparable quality.

Although the leads are clean looking after approximately 10 seconds in the initial sulfuric acid dip, in order to attain acceptable solder yields, it is necessary to slightly etch the leads; hence, the 30 second sulfuric acid exposure.

It should be understood that various alternatives to the process described herein may be employed in practicing the invention. It is intended that the following claims define the scope of the invention and that methods within the scope of these claims and their equivalents be covered thereby.

What is claimed is:

1. A method of removing oxides from the surface of the metal leads that extend from a packaged semiconductor integrated circuit device, the method comprising the steps of:
   a. exposing the leads to a fifty percent solution of sulfuric acid;
   b. rinsing the leads with city water;
   c. exposing the leads to a solution consisting of about fifty percent sulfuric acid, twenty-five percent nitric acid and twenty-five percent deionized water;
   d. sequentially rinsing the leads in city water and deionized water; and
   e. removing water from the leads.

2. A method as in claim 1 wherein the sulfuric acid solution utilized in step (a) of claim 1 is at about 150° F.

3. A method as in claim 1 wherein the deionized water is 2 M Ohm deionized water.

4. A method as in claim 1 wherein the hot deionized water used in step (d) of claim 1 is at about 135° F.

5. A method of removing oxides from the surface of metal leads, wherein the leads extend from a packaged semiconductor integrated circuit device, the method comprising the sequential steps of:
 a. exposing the leads to a fifty percent solution of sulfuric acid at about 150° F. for about 10–30 seconds;
 b. rinsing the leads with city water;
 c. exposing the leads to a solution consisting of about fifty percent sulfuric acid, twenty-five percent nitric acid and twenty-five percent deionized water;
 d. sequentially rinsing the leads in city water, deionized water and deionized water at about 135° F.; and
 e. drying the leads.

6. A method as in claim 5 wherein the sulfuric acid exposure of step (a) of claim 1 is for about 30 seconds.

* * * * *